(12) United States Patent
Chen et al.

(10) Patent No.: US 11,973,070 B2
(45) Date of Patent: Apr. 30, 2024

(54) DOUBLE-LAYER STACKED 3D FAN-OUT PACKAGING STRUCTURE AND METHOD MAKING THE SAME

(71) Applicant: SJ SEMICONDUCTOR (JIANGYIN) CORPORATION, Jiangyin (CN)

(72) Inventors: Yenheng Chen, Jiangyin (CN); Chengchung Lin, Jiangyin (CN)

(73) Assignee: SJ Semiconductor (Jiangyin) Corporation, Jiangyin (CN)

( * ) Notice: Subject to any disclaimer, the term of this patent is extended or adjusted under 35 U.S.C. 154(b) by 175 days.

(21) Appl. No.: 17/564,121

(22) Filed: Dec. 28, 2021

(65) Prior Publication Data

US 2022/0271018 A1    Aug. 25, 2022

(30) Foreign Application Priority Data

Feb. 20, 2021   (CN) .......................... 202110194401.5
Feb. 20, 2021   (CN) .......................... 202120383007.1

(51) Int. Cl.
| | |
|---|---|
| *H01L 25/10* | (2006.01) |
| *H01L 23/00* | (2006.01) |
| *H01L 23/31* | (2006.01) |
| *H01L 23/498* | (2006.01) |
| *H01L 25/00* | (2006.01) |

(52) U.S. Cl.
CPC ........ *H01L 25/105* (2013.01); *H01L 23/3128* (2013.01); *H01L 23/49822* (2013.01); *H01L 23/49894* (2013.01); *H01L 24/04* (2013.01); *H01L 24/16* (2013.01); *H01L 24/73* (2013.01); *H01L 25/50* (2013.01); *H01L 2224/0401* (2013.01); *H01L 2224/16225* (2013.01); *H01L 2224/73204* (2013.01)

(58) Field of Classification Search
CPC ................... H01L 25/105; H01L 25/50; H01L 2225/1005; H01L 23/3128; H01L 23/49822; H01L 23/49844; H01L 24/04; H01L 24/16; H01L 24/73
USPC .......................................... 257/686, 777, 132
See application file for complete search history.

(56) References Cited

U.S. PATENT DOCUMENTS

2016/0071820 A1* 3/2016 Yu ....................... H01L 23/3107
257/737

* cited by examiner

*Primary Examiner* — Jasmine J Clark
(74) *Attorney, Agent, or Firm* — IPRTOP LLC

(57) ABSTRACT

The present disclosure provides a double-layer stacked 3D fan-out packaging structure and a method making the structure. The structure includes: a first semiconductor chip, a packaging material layer, a metal connecting pillar, a first rewiring layer, a second rewiring layer, a second semiconductor chip, solder ball bumps, and an underfill layer under the second semiconductor chip. The formed double-layer stacked 3D fan-out packaging structure is capable to package two sets of fan-out wafers in the three-dimension. A single package stacked up after die-cutting has two sets of chips in the third direction. The electrical signals of all chips in a single package can be controlled by arranging a first rewiring layer, a metal connecting post, and the second rewiring layer, so that more chips can be packaged in a single package, thus improving the package integration level and reducing the package volume.

11 Claims, 6 Drawing Sheets

DOUBLE-LAYER STACKED 3D FAN-OUT PACKAGING STRUCTURE AND METHOD MAKING THE SAME

CROSS REFERENCE TO RELATED APPLICATION

The present application claims the benefit of priority to Chinese Patent Application No. CN2021101944015, entitled "Double-layer Stacked 3D Fan-out Packaging Structure and Method Making the Same", filed with CNIPA on Feb. 20, 2021, and Chinese Patent Application No. CN2021203830071, entitled "Double-layer Stacked 3D Fan-out Packaging Structure", filed with CNIPA also on Feb. 20, 2021, the content of which is incorporated herein by reference in their entireties.

FIELD OF TECHNOLOGY

The present disclosure relates to the technical field of chip packaging, in particular, to a double-layer stacked three-dimensional (3D) fan-out packaging structure and a method making the same.

BACKGROUND

Integrated circuit (IC) packaging field has made tremendous progress in meeting requirements for making lower cost, more reliable, faster, and higher density circuits. IC packaging will continue to shrink the minimum feature sizes in the future to increase the integration density of various electronic components. Currently, advanced packaging methods include: Wafer Level Chip Scale Packaging (WLCSP), Fan-Out Wafer Level Package (FOWLP), Flip Chip, Package-on-Package (POP), etc.

Fan-out wafer-level packaging is a wafer-level processing embedded chip packaging method. It is currently one of the advanced packaging methods with more input/output (I/O) ports and better integration flexibility. Fan-out wafer-level packaging has its unique advantages compared to conventional wafer-level packaging techniques: 1) The I/O pitch is more flexible and does not depend on the chip size. 2) Only one effective die is involved, so the product yield is improved. 3) Fan-out wafer-level packaging has a flexible 3D packaging path, that is, an arbitrary array of graphics can be formed on the top. 4) Fan-out wafer-level packaging has good electrical and thermal properties. 5) Fan-out wafer-level packaging is applied in high frequency electronics. 6) It is easy for fan-out wafer-level packaging to realize high-density wiring in the rewiring layer (RDL).

At present, fan-out wafer-level packaging is mostly done with single-layer packaging, that is, a layer of fan-out chip is packaged on a substrate. The current conventional process includes: providing a substrate and disposing an adhesive layer on a surface of the substrate; placing a chip face up on a surface of an adhesive layer; coating a dielectric layer; performing lithography/etch patterning and electroplating to form a rewiring layer (RDL); packaging the chip in a packaging material layer by an injection molding process; grinding and opening; performing lithography/etch patterning and electroplating to form an under-bump-metal (UBM) layer; ball-planting and reflowing to form an array of solder balls; and removing the substrate. The wafer package formed by this packaging method contains only one chip in a single chip package formed after die cutting. Given the current desire for higher-density circuits, the circuit interconnection among multiple chips requires re-packaging already packaged chips multiple times, which results in a low integration level and a large package volume, thus affecting the performance of a single chip.

SUMMARY

Some embodiments of the present disclosure provide a double-layer stacked 3D fan-out packaging structure and a method making the same, to solve the problems of the conventional fan-out wafer-level package, such as low integration, large package volume, and affecting the performance of a single chip.

One embodiment provides a double-layer stacked 3D fan-out packaging structure. The structure includes a first semiconductor chip, a packaging material layer, a metal connecting pillar, a first rewiring layer, a second rewiring layer, a second semiconductor chip, a solder ball bump, and an underfill layer.

The packaging material layer includes a first surface and a second surface opposite to the first surface, and the packaging material layer is disposed in a periphery area of the first semiconductor chip.

The metal connecting pillar is disposed penetrating through the packaging material layer.

The first rewiring layer is disposed on the first surface of the packaging material layer, and electrically connected to the first semiconductor chip and the metal connecting pillar.

The second rewiring layer is disposed on the second surface of the first packaging material, and electrically connected to the metal connecting pillar. The second rewiring layer electrically connects to the first rewiring layer through the metal connecting pillar. The first semiconductor chip is bonded to the second rewiring layer.

The second semiconductor chip is disposed on a surface of the second rewiring layer away from the first semiconductor chip, and electrically connected to the second rewiring layer.

The solder ball bump is disposed on a surface of the first rewiring layer away from the first semiconductor chip, and electrically connected to the first rewiring layer.

The underfill layer is disposed between the second semiconductor chip and the second rewiring layer and in a lower area of a periphery area of the second semiconductor chip.

In some example, the first semiconductor chip is a first bare chip or a first packaged chip, and the second semiconductor chip is a second bare chip or a second packaged chip.

In some example, the first bare chip includes a contact pad, a dielectric layer formed on the contact pad, and a metal pillar formed in the dielectric layer and penetrating the dielectric layer. One end of the metal pillar is connected to the contact pad, and another end of the metal pillar is connected to the first rewiring layer.

In some example, the first packaged chip includes a contact pad. A solder connection structure is formed on the first packaged chip, and the solder connection structure includes a metal pillar and a solder ball. One end of the metal pillar is connected to the contact pad, another end of the metal pillar is connected to the solder ball, and the solder ball is connected to the first rewiring layer.

In some example, the second bare chip includes a contact pad, a dielectric layer formed on the contact pad, and a metal pillar formed in the dielectric layer and penetrating the dielectric layer. One end of the metal pillar is connected to the contact pad, and another end of the metal pillar is connected to the second rewiring layer.

In some example, the second packaged chip includes a contact pad. A solder connection structure is formed on the second packaged chip, and the solder connection structure includes a metal pillar and a solder ball. One end of the metal pillar is connected to the contact pad, another end of the metal pillar is connected to the solder ball, and the solder ball is connected to the second rewiring layer.

In some example, the first rewiring layer includes a first wiring dielectric layer and a first metal wiring layer disposed in the first wiring dielectric layer. The second rewiring layer includes a second wiring dielectric layer and a second metal wiring layer disposed in the second wiring dielectric layer; a material of the first wiring dielectric layer and a material of the second wiring dielectric layer each includes one or more of epoxy resin, silicone rubber, polyimide (PI), polybenzoxazole (PBO), benzocyclobutene (BCB), silicon oxide, phosphorosilicate glass, and fluorine-containing glass; and a material of the first metal wiring layer and a material of the second metal wiring layer each includes one or more of copper, aluminum, nickel, gold, silver, and titanium.

In some example, the packaging material layer includes one or more of a polyimide layer, a silicone rubber layer, and an epoxy resin layer; and the underfill layer includes an epoxy resin layer.

In some example, a material of the solder ball bump includes one or more of copper, aluminum, nickel, gold, silver, and titanium.

The present disclosure further provides a method for making a double-layer stacked 3D fan-out packaging structure. The method includes: providing a first supporting substrate; disposing a separation layer on the first supporting substrate; forming a second rewiring layer on the separation layer; forming a metal connection pillar on the second rewiring layer, the metal connection pillar is electrically connected to the second rewiring layer; providing a first semiconductor chip and bonding the first semiconductor chip to the second rewiring layer; forming a packaging material layer on a surface of the second rewiring layer, the packaging material layer fills a gap between the first semiconductor chip and the metal connecting pillar and packages the first semiconductor chip and the metal connecting pillar, the packaging material layer includes a first surface and a second surface opposite to the first surface, the second surface of the packaging material layer is in contact with the second rewiring layer, and the first surface of the packaging material layer exposes the metal connecting pillar; forming a first rewiring layer on the first surface of the packaging material layer, the first rewiring layer is electrically connected to the first semiconductor chip and the metal connecting pillar; forming a solder bump on a surface of the first rewiring layer away from the first semiconductor chip, the solder bump is electrically connected to the first rewiring layer; providing a second supporting substrate and bonding the second supporting substrate to the first rewiring layer; removing the first supporting substrate and the separation layer to expose the second rewiring layer; providing a second semiconductor chip and electrically connecting the second semiconductor chip to the second rewiring layer; forming an underfill layer between the second semiconductor chip and the second rewiring layer and in a lower area of a periphery area of the second semiconductor chip; and removing the second supporting substrate.

In some example, the first supporting substrate includes one of a glass substrate, a metal substrate, a semiconductor substrate, a polymer substrate, and a ceramic substrate; the second supporting substrate includes one of a glass substrate, a metal substrate, a semiconductor substrate, a polymer substrate, and a ceramic substrate; and the separation layer is a polymer layer or an adhesive layer, the separation layer is coated on the surface of the first supporting substrate by a spin coating process, then cured and molded by an ultraviolet curing or thermal curing process.

In some example, the first rewiring layer includes a first wiring dielectric layer and a first metal wiring layer disposed in the first wiring dielectric layer, and the second rewiring layer includes a second wiring dielectric layer and a second metal wiring layer disposed in the second wiring dielectric layer; a material of the first wiring dielectric layer and a material of the second wiring dielectric layer each includes one or more of epoxy resin, silicone rubber, polyimide (PI), polybenzoxazole (PBO), benzocyclobutene (BCB), silicon oxide, phosphorosilicate glass, and fluorine-containing glass, and a material of the first metal wiring layer and a material of the second metal wiring layer includes one or more of copper, aluminum, nickel, gold, silver, and titanium.

In some example, the forming of the first rewiring layer and the second rewiring layer includes: forming a dielectric layer using a chemical vapor deposition process or a physical vapor deposition process, and etching the dielectric layer to form the wiring dielectric layer, and forming a metal layer on a surface of the wiring dielectric layer using a chemical vapor deposition process, a physical vapor deposition process, a sputtering process, an electroplating process, or an electroless plating process, and etching the metal layer to form a metal wiring layer, the metal connection pillar is electrically connected to the metal wiring layer.

In some example, the first semiconductor chip is a first bare chip or a first packaged chip, and the second semiconductor chip is a second bare chip or a second packaged chip.

In some example, the first bare chip includes a contact pad, a dielectric layer formed on the contact pad, and a metal pillar formed in the dielectric layer and penetrating the dielectric layer. One end of the metal pillar is connected to the contact pad, and another end of the metal pillar is connected to the first rewiring layer.

In some example, the first packaged chip includes a contact pad. A solder connection structure is formed on the first packaged chip, and the solder connection structure includes a metal pillar and a solder ball. One end of the metal pillar is connected to the contact pad, another end of the metal pillar is connected to the solder ball, and the solder ball is connected to the first rewiring layer.

In some example, the second bare chip includes a contact pad, a dielectric layer formed on the contact pad, and a metal pillar formed in the dielectric layer and penetrating the dielectric layer. One end of the metal pillar is connected to the contact pad, and another end of the metal pillar is connected to the second rewiring layer.

In some example, the second packaged chip includes a contact pad, a solder connection structure is formed on the second packaged chip, and the solder connection structure includes a metal pillar and a solder ball. One end of the metal pillar is connected to the contact pad, another end of the metal pillar is connected to the solder ball, and the solder ball is connected to the second rewiring layer.

As mentioned above, the present disclosure provides a double-layer stacked 3D fan-out packaging structure and a method making the same. The formed double-layer stacked 3D fan-out packaging structure can package two layers of fan-out wafers in the third-dimensional direction (i.e., the thickness direction). A single package formed after die cutting has two layers of chips in the three-dimensional direction. The electrical signals of all chips in a single package can be controlled by arranging a first rewiring layer, a metal connecting post, and the second rewiring layer, so that more chips can be packaged in a single package, the integration of the fan-out wafer level package is improved, and the package volume can shrink. Furthermore, packaging multiple chips in the same package can effectively improve the performance of a single chip. Finally, the method also makes it possible to package more than three layers of fan-out wafer in a single package.

Figure 1:
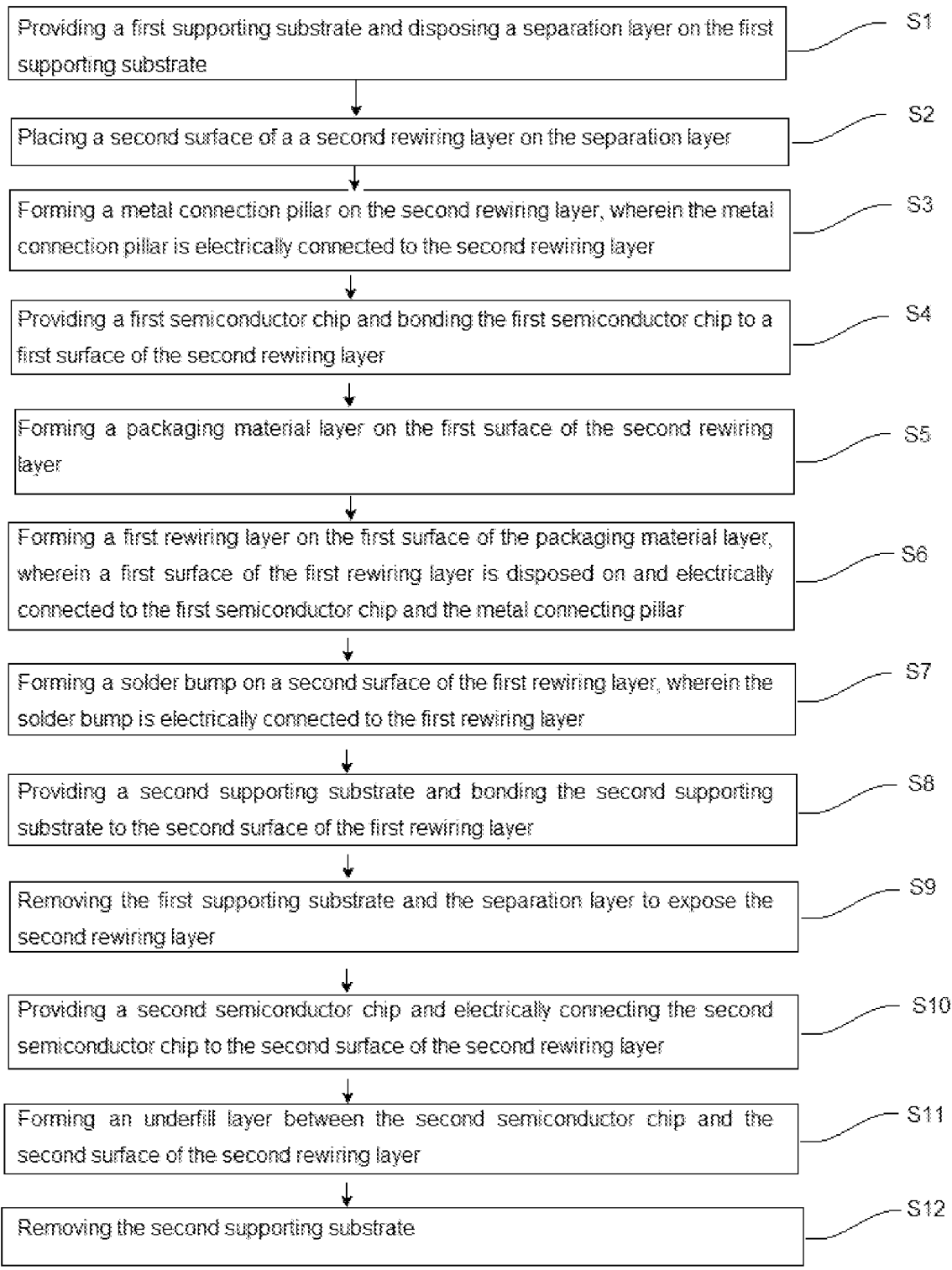
FIG. 1 shows a schematic flowchart of a method for making a double-layer stacked 3D fan-out packaging structure according to Embodiment 1 of the present disclosure.

| Description of Reference Numerals | |
|---|---|
| 10 | First supporting substrate |
| 11, 22 | Separation layer |
| 12 | Second rewiring layer |
| 121, 161 | Wiring dielectric layer |
| 122, 162 | Metal wiring layer |
| 123 | Etched window |
| 13 | Metal connecting pillar |
| 14 | First semiconductor chip |
| 141, 191 | Contact pad |
| 142 | Dielectric layer |
| 143, 192 | Metal pillar |
| 15 | Packaging material layer |
| 16 | First rewiring layer |
| 17 | Solder ball bump |
| 18 | Second supporting substrate |
| 19 | Second semiconductor chip |
| 193 | Solder ball |
| 20 | Underfill layer |
| 21 | Adhesive layer |
| S1-S12 | Steps of method making the packaging device |

DETAILED DESCRIPTION

The present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Referring to FIGS. 1-16, it needs to be stated that the drawings provided in the following embodiments are just used for schematically describing the basic concept of the present disclosure, thus only illustrating components related to the present disclosure and are not drawn according to the numbers, shapes and sizes of the components during actual implementation. The configuration, number and scale of each component during actual implementation thereof may be changed according to actual needs, and the layout configuration of the components thereof may be more complicated.

Embodiment 1

As shown in FIG. 1, this embodiment provides a method for making a double-layer stacked 3D fan-out packaging structure. The double-layer stacked 3D fan-out packaging structure formed by the method can package two layers of fan-out wafers in the third-dimensional direction (i.e., the thickness direction). A single package formed after die cutting has two layers of chips in the third-dimensional direction. The electrical signals of all chips in a single package can be controlled by arranging the first rewiring layer, the metal connecting post, and the second rewiring layer, so that more chips can be packaged in a single package, the integration level of the fan-out wafer level package is improved, and the package volume can be reduced. Furthermore, packaging multiple chips in the same package can effectively improve the performance of the single chip. Finally, the method also makes it possible to package more than three layers of fan-out wafers in one single package.

Specifically, FIGS. 2-16 illustrate schematic views of the double-layer stacked 3D fan-out packaging structure after each step of the method for making it, according to this embodiment. For ease of understanding, the figures show only one chip per layer of wafer during the presentation of the structures in each step, but those skilled in the art can understand that the number of chips per layer of fan-out wafer is not one, generally several, that is, more than two.

Figure 2:
FIGS. 2-16 illustrate schematic views of the structures after each step of the method for making the double-layer stacked 3D fan-out packaging structure according to Embodiment 1 of the present disclosure, in addition, FIG. 16 also shows a schematic view of the double-layer stacked 3D fan-out packaging structure according to Embodiment 2 of the present disclosure.
Figure 3:

As shown in FIGS. 1-3, step S1 is first performed, a first supporting substrate 10 (as shown in FIG. 2) is provided, and a separation layer 11 is disposed on the first supporting substrate 10 (as shown in FIG. 3).

As shown in FIG. 2, as an example, the first supporting substrate 10 includes one of a glass substrate, a metal substrate, a semiconductor substrate, a polymer substrate, and a ceramic substrate. In this embodiment, the first supporting substrate 10 is a glass substrate, which has a lower cost than other substrates, a separation layer 11 is easily disposed on its surface, which also has an easier subsequent peeling process. The shape of the first supporting substrate 10 may be round, square or any other desired shapes. In this embodiment, the first supporting substrate 10 is used to prevent the chip from cracking, warping, breaking, etc., during subsequent manufacturing processes.

As shown in FIGS. 3-11, the separation layer 11 keeps a second rewiring layer 12 subsequently formed and other structures on the second rewiring layer 12 away from the first supporting substrate 10. The separation layer 11 is preferably made of an adhesive material with a smooth surface. The separation layer 11 has a certain bonding force with the second rewiring layer 12 to ensure that the second rewiring layer 12 will not move in subsequent processes. In addition, the separation layer 11 has a strong bonding force with the first supporting substrate 10. Generally speaking, the bonding force between the separation layer 11 and the first supporting substrate 10 is greater than the bonding force between the separation layer 11 and the second rewiring layer 12. As an example, the separation layer 11 is a polymer layer or an adhesive layer. The polymer layer or adhesive layer is first coated on the surface of the first supporting substrate 10 by a spin coating process, and then cured and molded by an ultraviolet light curing or thermal curing process.

In this embodiment, the polymer layer includes a light-to-heat conversion (LTHC) layer. When the first supporting substrate 10 is peeled off subsequently, the LTHC layer may be heated by a laser when separating the second rewiring layer 12 from the first supporting substrate 10.

Figure 4:
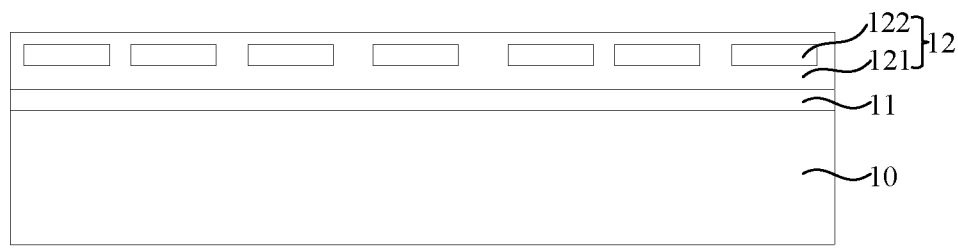

As shown in FIGS. 1 and 4, step S2 is performed, a second rewiring layer 12 is formed on the separation layer 11.

As shown in FIG. 4, as an example, the second rewiring layer 12 includes a wiring dielectric layer 121 and a metal wiring layer 122 disposed in the wiring dielectric layer 121. The material of the wiring dielectric layer 121 includes one or more of epoxy resin, silicone rubber, polyimide (PI), polybenzoxazole (PBO), benzocyclobutene (BCB), silicon oxide, phosphorosilicate glass, and fluorine-containing glass. The material of the metal wiring layer 122 includes one or more of copper, aluminum, nickel, gold, silver, and titanium.

As an example, forming the second rewiring layer 12 includes the following steps: first, disposing a dielectric layer on the surface of the separation layer 11 by a chemical vapor deposition process or a physical vapor deposition process, and etching the dielectric layer to form a patterned wiring dielectric layer 121; then forming a metal layer on the surface of the wiring dielectric layer 121 by a chemical vapor deposition process, a physical vapor deposition process, a sputtering process, an electroplating process, or an electroless plating process, and the metal layer is etched back to form a metal wiring layer 122, which is then disposed on by a dielectric layer of the same material as that of the dielectric layer 121. It should be noted that the materials, number of layers, and distribution of the wiring dielectric layer 121 and the metal wiring layer 122 may be set according to the specific conditions of the chips, which are not limited here.

Figure 5:
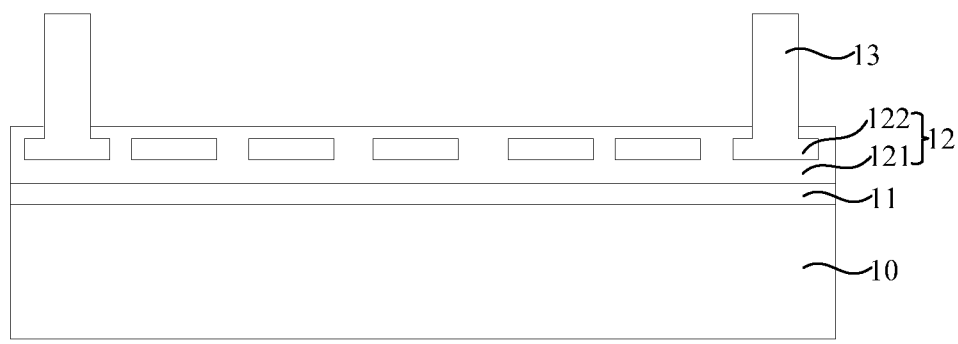

As shown in FIGS. 1 and 5, step S3 is performed, in this step, a metal connection pillar 13 is formed on the second rewiring layer 12, and the metal connection pillar 13 is electrically connected to the second rewiring layer 12.

As shown in FIG. 5, as an example, when the second rewiring layer 12 includes the wiring dielectric layer 121 and the metal wiring layer 122 disposed in the wiring dielectric layer 121, the metal connecting pillar 13 contacts with the metal wiring layer 122 through a standard patterning process which is not described here, thereby achieving electrical connection between the metal connecting pillar 13 and the second rewiring layer 12.

As an example, the material of the metal connecting pillar 13 includes one or more of gold wire, silver wire, copper wire, and aluminum wire. The metal connecting pillar 13 may also include one or more of gold pillar, silver pillar, copper pillar, and aluminum pillar. The method of forming the metal connecting pillar 13 includes one or more of wire bonding, electroplating, and electroless plating.

Specifically, the metal connecting pillar 13 may be a copper wire, and formed by a wire bonding process, such as one or more of a hot-pressed wire bonding process, an ultrasonic wire bonding process, and a hot-pressed ultrasonic wire bonding process. The type and forming method of the metal connecting column 13 may also be selected according to needs, and there is no limitation here.

Figure 6:
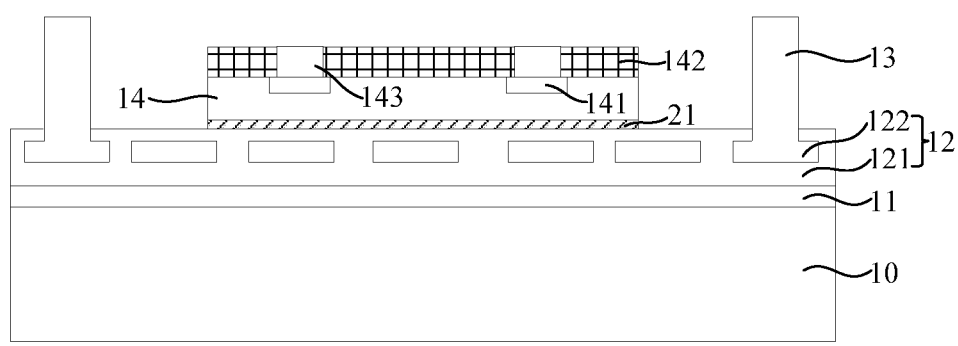

As shown in FIGS. 1 and 6, step S4 is performed, a first semiconductor chip 14 is provided and bonded with the second rewiring layer 12.

As an example, the form of the first semiconductor chip 14 is not limited, that is, the first semiconductor chip 14 may be an unpackaged bare chip or a packaged chip, and in this layer of fan-out wafer, the form of the first semiconductor chip 14 may be the same or different, and it may be set according to actual needs. As shown in FIG. 6, the first semiconductor chip 14 is a bare chip, the bare chip includes a contact pad 141, a dielectric layer 142 is formed on the bare chip, and a metal pillar 143 is formed in the dielectric layer 142 and penetrates the dielectric layer 142. One end of the metal pillar 143 is connected to the contact pad 141, and the other end of the metal pillar 143 is connected to a first rewiring layer 16 to be formed later.

As shown in FIG. 6, as an example, the first semiconductor chip 14 may be bonded to the second rewiring layer 12 through an adhesive layer 21 to ensure that the first semiconductor chip 14 will not move in subsequent processes and during use. The material of the adhesive layer 21 may be a double-sided adhesive tape or an adhesive glue made by a spin coating process, but it is not limited to this, as long as the adhesive layer 21 has the required adhesive performance.

Figure 7:
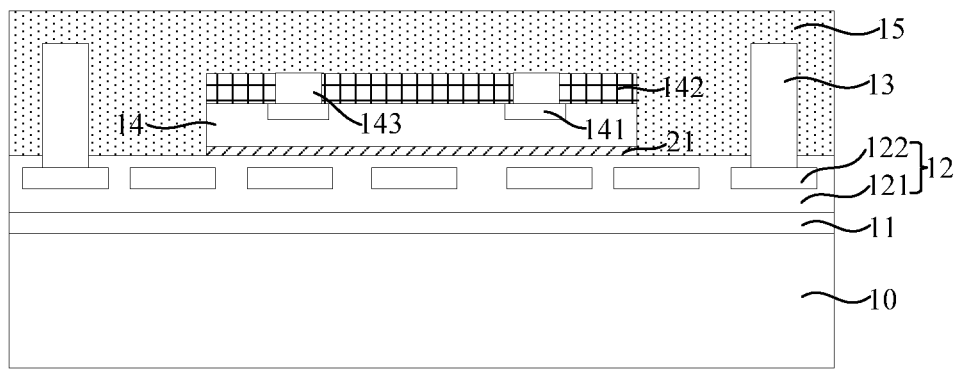
Figure 8:
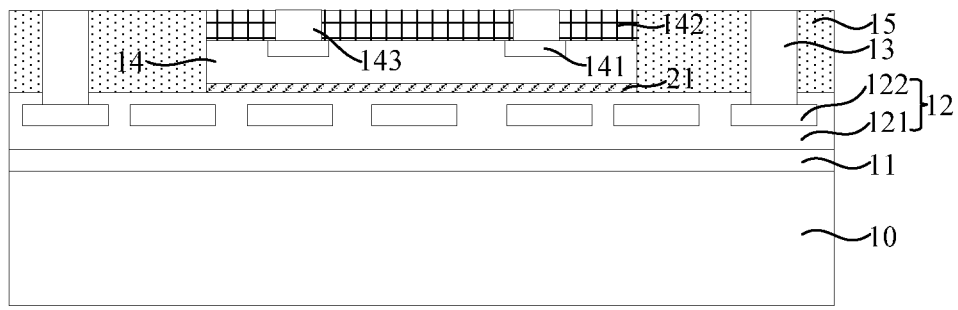

As shown in FIGS. 1, 7, and 8, step S5 is performed, a packaging material layer 15 is formed on the surface of the second rewiring layer 12, and the packaging material layer 15 fills the gap between the first semiconductor chip 14 and the metal connecting pillar 13 and packages the first semiconductor chip 14 and the metal connecting pillar 13. The packaging material layer 15 includes a first surface and a second surface opposite to the first surface. The second surface of the packaging material layer 15 is in contact with the second rewiring layer 12, and the first surface of the packaging material layer 15 exposes the metal connecting pillar 13.

As an example, the packaging material layer 15 includes one or more of a polyimide layer, a silicone rubber layer, and an epoxy resin layer. A method of forming the packaging material layer 15 includes one of more of compression molding, transfer molding, liquid sealing molding, vacuum lamination, and spin coating.

Specifically, a layer of packaging material layer 15 is formed on the surface of the second rewiring layer 12 (as shown in FIG. 7), and then the top surface of the packaging material layer 15 is polished or planarized to form a flat packaging material layer 15 (as shown in FIG. 8), which improves product surface quality.

In another example, the packaging material layer 15 may also be formed align with the height of the metal connecting pillar 13, so that the height of the packaging material layer 15 is the same as the height of the metal connecting pillar 13. That is, the first surface of the packaging material layer 15 is flush with the surface of the metal connecting pillar 13. In this way, the step of planarizing the packaging material layer 15 can be omitted, thereby simplifying the process.

Figure 9:
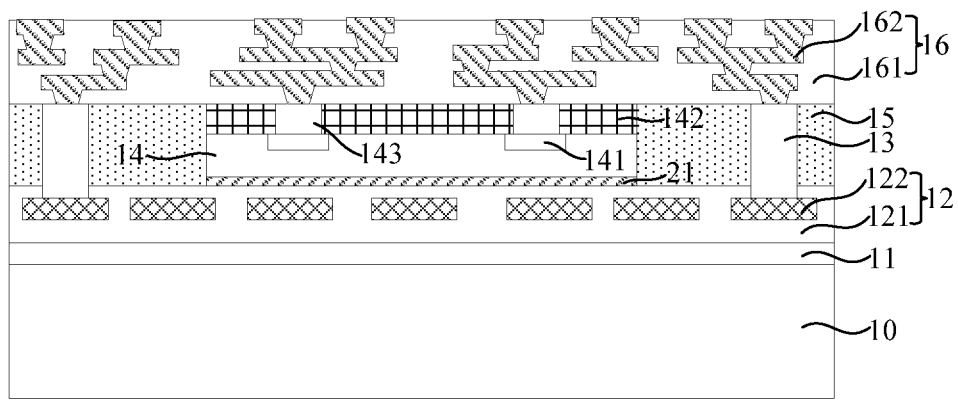

As shown in FIGS. 1 and 9, step S6 is performed, a first rewiring layer 16 is formed on the first surface of the packaging material layer 15, and the first rewiring layer 16 is electrically connected to the first semiconductor chip 14 and the metal connecting pillar 13. After this step, the electrical signal of the first semiconductor chip 14 is controlled by the first rewiring layer 16, and the electrical signal of the second semiconductor chip 19 formed later is controlled by the first rewiring layer 16 through the second rewiring layer 12 and the metal connecting pillar 13, that is, both the first semiconductor chip 14 and the second semiconductor chip 19 formed later are controlled by the first rewiring layer 16.

As shown in FIG. 9, as an example, the first rewiring layer 16 includes a wiring dielectric layer 161 and a metal wiring layer 162 located in the wiring dielectric layer 161. The material of the wiring dielectric layer 161 includes one or more of epoxy resin, silicone rubber, polyimide (PI), polybenzoxazole (PBO), benzocyclobutene (BCB), silicon oxide, phosphorosilicate glass, and fluorine-containing glass. The material of the metal wiring layer 162 includes one or more of copper, aluminum, nickel, gold, silver, and titanium.

As an example, forming the first rewiring layer 16 includes the following steps: first, a dielectric layer is formed on the surface of the packaging material layer 15 by a chemical vapor deposition process or a physical vapor deposition process, and the dielectric layer is etched to form the wiring dielectric layer 161; then a metal layer is formed on the surface of the wiring dielectric layer 161 by a chemical vapor deposition process, a physical vapor deposition process, a sputtering process, an electroplating process, or an electroless plating process, and the metal layer is etched to form a metal wiring layer 162. It should be noted that the materials, number of layers, and distribution of the wiring dielectric layer 161 and the metal wiring layer 162 may be set according to the specific conditions of the chips, those arrangements will not be limited by the examples here.

Figure 10:
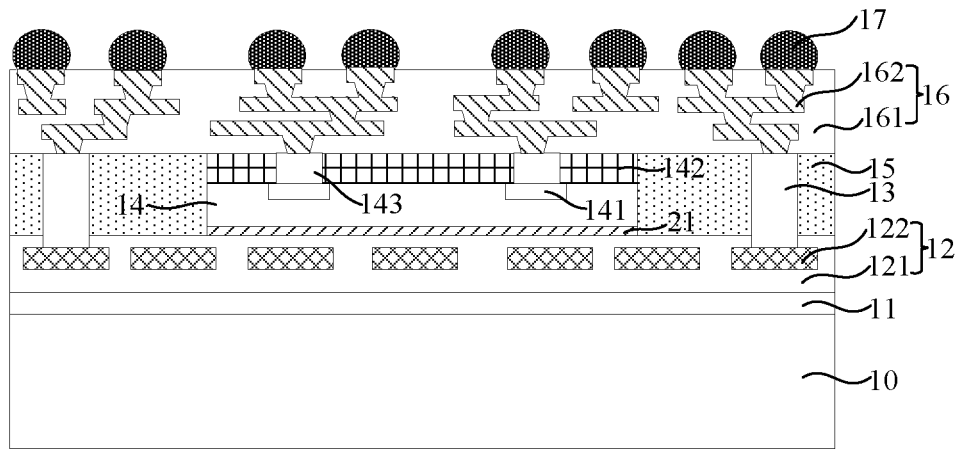

As shown in FIGS. 1 and 10, step S7 is performed, solder bumps 17 are formed on the surface of the first rewiring layer 16 away from the first semiconductor chip 14, and the solder bumps 17 are electrically connected to the first rewiring layer 16.

As an example, the material of the solder ball bumps 17 includes one or more of copper, aluminum, nickel, gold, silver, and titanium, and the solder ball bumps 17 may be formed by a ball-planting and reflowing process.

Figure 11:
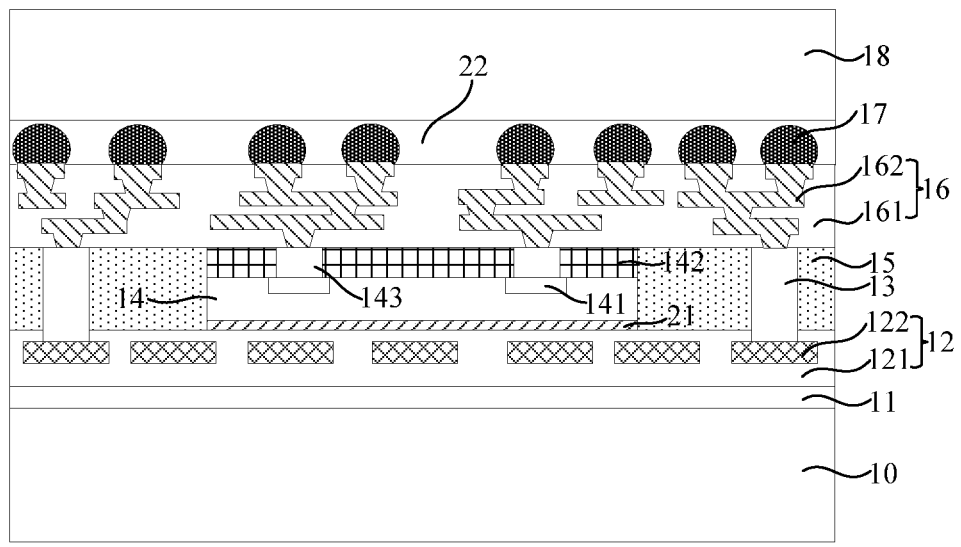

As shown in FIGS. 1 and 11, step S8 is performed, a second supporting substrate 18 is provided and bonded to the first rewiring layer 16.

As shown in FIG. 11, as an example, the second supporting substrate 18 includes one of a glass substrate, a metal substrate, a semiconductor substrate, a polymer substrate, and a ceramic substrate. In this embodiment, the second supporting substrate 18 is a glass substrate. The glass substrate has a low cost, is easy to dispose a separation layer 22 on its surface, and can reduce the difficulty of the subsequent peeling process. The shape of the second supporting substrate 18 may be round, square or any other desired shapes. In this embodiment, the second supporting substrate 18 is used to prevent the chip from cracking, warping, breaking, etc. during subsequent manufacturing processes.

As shown in FIG. 11, as an example, a separation layer 22 may be disposed between the second supporting substrate 18 and the first rewiring layer 16 to achieve adhesion between the two. As an example, the separation layer 22 includes a polymer layer or an adhesive layer.

Figure 12:
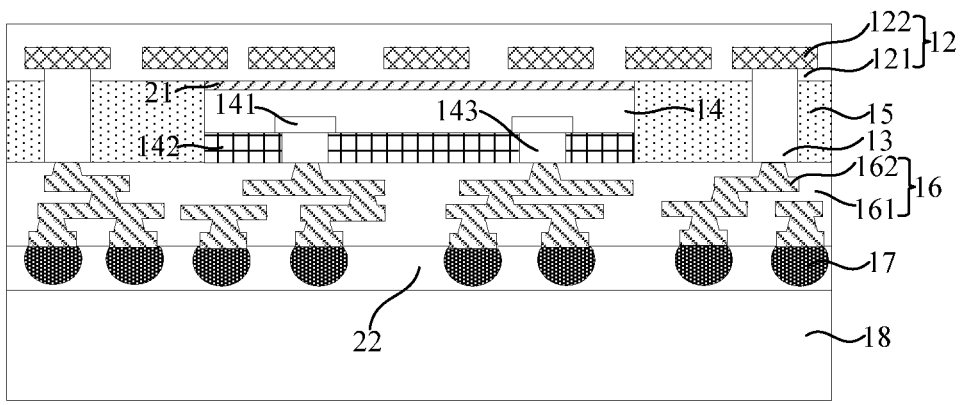

As shown in FIGS. 1 and 12, step S9 is performed, the first supporting substrate 10 and the separation layer 11 are removed to expose the second rewiring layer 12.

As an example, when the separation layer 11 includes an adhesive layer, an exposure method may be used to reduce the viscosity of the adhesive, to separate the separation layer 11 from the second rewiring layer 12. When the separation layer 11 includes an LTHC layer, the LTHC layer is heated using a laser to separate the second rewiring layer 12 from the first supporting substrate 10.

Figure 13:
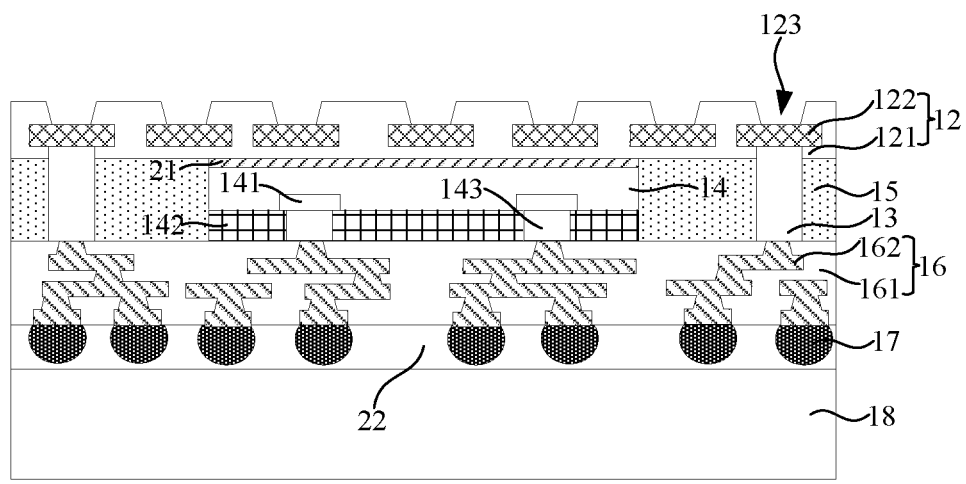
Figure 14:
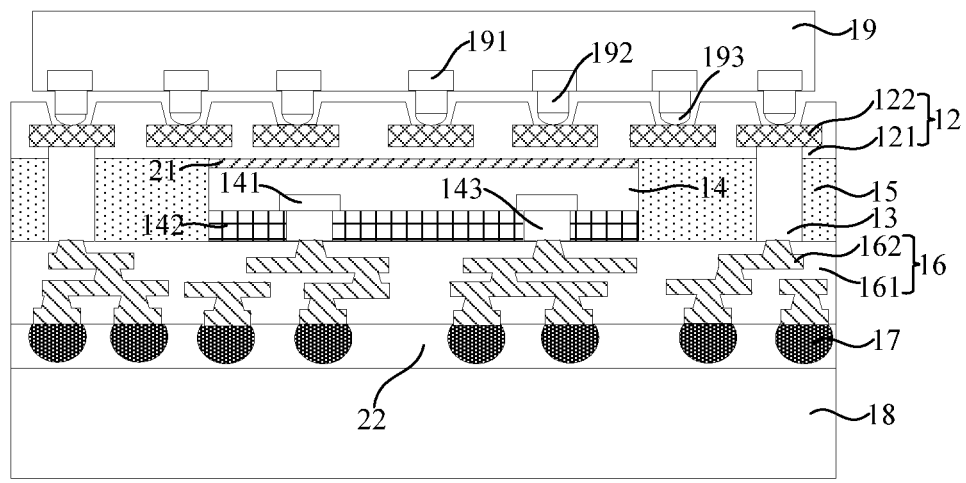

As shown in FIGS. 1, 13, and 14, step S10 is performed, a second semiconductor chip 19 is provided and electrically connected to the second rewiring layer 12. After this step, the second semiconductor chip 19 is electrically connected to the second rewiring layer 12, and the second rewiring layer 12 is electrically connected to the first rewiring layer 16 through the metal connecting pillar 13, thereby achieving electrical connection between the first rewiring layer 16 and the second rewiring layer 12.

As an example, the form of the second semiconductor chip 19 is not limited, that is, the second semiconductor chip 19 may be an unpackaged bare chip or a packaged chip. In this layer of fan-out wafer, the chip 19 may be of the same or different form, and it may be set according to actual needs. As shown in FIG. 14, the second semiconductor chip 19 is a packaged chip. The packaged chip includes contact pads 191. Solder connection structures are formed on the packaged chip. Each of the solder connection structures includes a metal pillar 192 and a solder ball 193. One end of the metal pillar 192 is connected to the contact pad 191, the other end is connected to the solder ball 193, and the solder ball 193 is connected to the second rewiring layer 12. As shown in FIG. 13, the wiring dielectric layer 121 in the second rewiring layer 12 is etched using laser etching, using such as an infrared laser, to form an etched window 123 that exposes the metal wiring layer 122. As shown in FIG. 14, the second semiconductor chip 19 is electrically connected to the second rewiring layer 12 through the solder balls 193.

Figure 15:
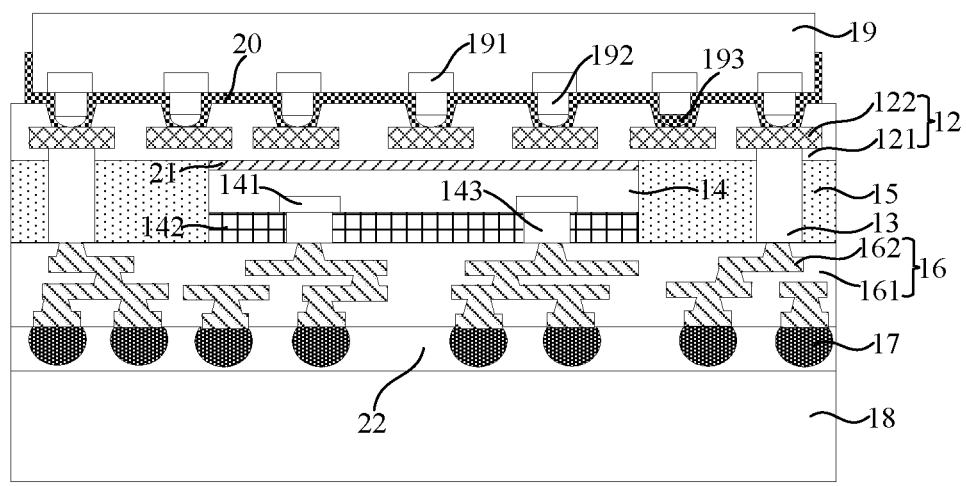

As shown in FIGS. 1 and 15, step S11 is performed, an underfill layer 20 is formed between the second semiconductor chip 19 and the second rewiring layer 12 and in a lower area of a periphery area of the second semiconductor chip 19. The underfill layer 20 can improve the bonding strength between the second semiconductor chip 19 and the second rewiring layer 12 and also protect the second rewiring layer 12. The material of the underfill layer 20 has an excellent flexibility, stickiness and surface wetting properties, thus it has a better gap-filling and bonding strength than the coarse packaging material of layer 15, so the underfill layer 20 fills well into the second rewiring layer 12 and effectively protects the second rewiring layer 12. The underfilling process can be realized with only one step, the process is simple, most packaging requirements can be met, and the cost is low.

As an example, the underfill layer may be an epoxy resin layer, but it may also be other filler materials with similar flexibility, stickiness, wetting and gap-filling characters. A method of forming the underfill layer 20 includes, but is not limited to, one or more of inkjet, dispensing, compression molding, transfer molding, liquid sealing, vacuum lamination, and spin coating.

Figure 16:
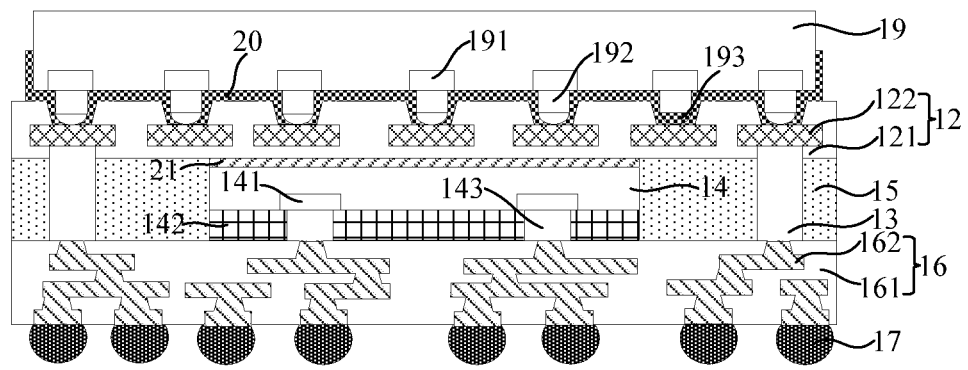

As shown in FIGS. 1 and 16, step S12 is performed, the second supporting substrate 18 is removed.

As an example, the second supporting substrate 18 and the first rewiring layer 16 are bonded through the separation layer 22. As an example, when the separation layer 22 includes an adhesive layer, an exposure method may be used to reduce the viscosity of the adhesive, to separate the separation layer 22 from the first rewiring layer 16. When the separation layer 22 includes an LTHC light-to-heat conversion layer, the LTHC light-to-heat conversion layer is heated using a laser to separate the first rewiring layer 16 from the second supporting substrate 18.

Embodiment 2

This embodiment provides a double-layer stacked 3D fan-out packaging structure. The package structure can be made by the method of Embodiment 1 above, but is not limited to the method described in Embodiment 1, as long as the double-layer stacked 3D fan-out packaging structure can be made. For the beneficial effects that can be achieved by the double-layer stacked 3D fan-out packaging structure, please refer to Embodiment 1, which will not be described in detail below.

As shown in FIG. 16, the double-layer stacked 3D fan-out packaging structure includes a first semiconductor chip 14, a packaging material layer 15, a metal connecting pillar 13, a first rewiring layer 16, a second rewiring layer 12, a second semiconductor chip 19, a solder ball bump 17, and an underfill layer 20.

The packaging material layer 15 includes a first surface and a second surface opposite to the first surface, and the packaging material layer 15 is disposed in a periphery of the first semiconductor chip 14.

The metal connecting pillar 13 is disposed penetrating through the packaging material layer 15.

The first rewiring layer 16 is disposed on a first surface of the packaging material layer 15, and electrically connected to the first semiconductor chip 14 and the metal connecting pillar 13.

The second rewiring layer 12 is disposed on a second surface of the first packaging material 15, and electrically connected to the metal connecting pillar 13, to realize electrical connection between the first rewiring layer 16 and the second rewiring layer 12 through the metal connecting pillar 13. The first semiconductor chip 14 is bonded to the second rewiring layer 12;

The second semiconductor chip 19 is disposed on a surface of the second rewiring layer 12 away from the first semiconductor chip 14, and electrically connected to the second rewiring layer 12.

The solder ball bump 17 is disposed on a surface of the first rewiring layer 16 away from the first semiconductor chip 14, and electrically connected to the first rewiring layer 16.

The underfill layer 20 is disposed to gap fill between the second semiconductor chip 19 and the second rewiring layer 12 and in a lower area of a periphery area of the second semiconductor chip 19.

As an example, the first semiconductor chip 14 is a bare chip or a packaged chip, and the second semiconductor chip 19 is a bare chip or a packaged chip. As shown in FIG. 16, the first semiconductor chip 14 is a bare chip, and the second semiconductor chip 19 is a packaged chip. Further, the bare chip includes a contact pad 141, a dielectric layer 142 is formed on the bare chip, and a metal pillar 143 is formed in the dielectric layer 142 and penetrates the dielectric layer 142. One end of the metal pillar 143 is connected to the contact pad 141, and the other end of the metal pillar 143 is connected to the first rewiring layer 16. The packaged chip includes contact pads 191. Solder connection structures are formed on the packaged chip. Each of the solder connection structures includes a metal pillar 192 and a solder ball 193. One end of the metal pillar 192 is connected to the contact pad 191, the other end is connected to the solder ball 193, and the solder ball 193 is connected to the second rewiring layer 12.

As an example, the first rewiring layer 16 includes a first wiring dielectric layer 161 and a first metal wiring layer 162 located in the first wiring dielectric layer 161, and the second rewiring layer 12 includes a second wiring dielectric layer 121 and a second metal wiring layer 122 located in the second wiring dielectric layer 121. The material of the first wiring dielectric layer 161 and the second wiring dielectric layer 121 includes one or more of epoxy resin, silicone rubber, PI, PBO, BCB, silicon oxide, phosphorosilicate glass, and fluorine-containing glass. The material of the first metal wiring layer 162 and the second metal wiring layer 122 includes one or more of copper, aluminum, nickel, gold, silver, and titanium.

As an example, the packaging material layer 15 includes one or more of a polyimide layer, a silicone rubber layer, and an epoxy resin layer. The underfill layer 20 includes an epoxy resin layer.

As an example, the material of the solder ball bumps 17 includes one or more of copper, aluminum, nickel, gold, silver, and titanium.

In summary, the present disclosure provides a double-layer stacked 3D fan-out packaging structure and a method making it. The formed double-layer stacked 3D fan-out packaging structure can package two layers of fan-out wafers in the third-dimensional (i.e., the thickness direction). A single package formed after die cutting has two layers of chips in the three-dimensional direction. The electrical signals of all chips in a single package can be controlled by arranging a first rewiring layer, a metal connecting post, and the second rewiring layer, so that more chips can be packaged in a single package, the integration of the fan-out wafer level package is improved, and the package volume may be smaller. Furthermore, packaging multiple chips in the same package can effectively improve the performance of a single chip. Finally, the method also makes it possible to package more than three layers of fan-out wafers in a single package. Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

We claim:

1. A method for making a double-layer stacked 3D fan-out packaging structure, comprising:
   providing a first supporting substrate;
   disposing a separation layer on the first supporting substrate;
   placing a second rewiring layer on the separation layer;
   forming a metal connecting pillar on the second rewiring layer by a wire bonding process, wherein the metal connecting pillar is electrically connected to the second rewiring layer;
   providing a first semiconductor chip and bonding the first semiconductor chip to a first surface of the second rewiring layer, wherein the first surface is opposite to the second surface;
   forming a packaging material layer on the first surface of the second rewiring layer, wherein the packaging material layer fills a gap between the first semiconductor chip and the metal connecting pillar and packages the first semiconductor chip and the metal connecting pillar, wherein the packaging material layer includes a first surface and a second surface opposite to the first surface, wherein the second surface of the packaging material layer is in contact with the first surface of the second rewiring layer, and the first surface of the packaging material layer exposes the metal connecting pillar;
   forming a first rewiring layer on the first surface of the packaging material layer, wherein a first surface of the first rewiring layer is disposed on and electrically connected to the first semiconductor chip and the metal connecting pillar;

forming a solder bump on a second surface of the first rewiring layer, wherein the solder bump is electrically connected to the first rewiring layer;

providing a second supporting substrate and bonding the second supporting substrate to the second surface of the first rewiring layer;

removing the first supporting substrate and the separation layer to expose the second rewiring layer;

providing a second semiconductor chip and electrically connecting the second semiconductor chip to the second surface of the second rewiring layer;

forming an underfill layer between the second semiconductor chip and the second surface of the second rewiring layer, wherein the underfill layer is arranged at a part of a periphery area of the second semiconductor chip; and removing the second supporting substrate.

2. The method for making the double-layer stacked 3D fan-out packaging structure according to claim 1, wherein the first supporting substrate comprises one of a glass substrate, a metal substrate, a semiconductor substrate, a polymer substrate, and a ceramic substrate;

wherein the second supporting substrate comprises one of a glass substrate, a metal substrate, a semiconductor substrate, a polymer substrate, and a ceramic substrate; and wherein the separation layer is a polymer layer or an adhesive layer, wherein the separation layer is coated on a surface of the first supporting substrate by a spin coating process, then cured and molded by an ultraviolet light curing or thermal curing process.

3. The method for making the double-layer stacked 3D fan-out packaging structure according to claim 1, wherein the first rewiring layer comprises a first wiring dielectric layer and a first metal wiring layer disposed in the first wiring dielectric layer, and wherein the second rewiring layer comprises a second wiring dielectric layer and a second metal wiring layer disposed in the second wiring dielectric layer;

wherein each of a material of the first wiring dielectric layer and a material of the second wiring dielectric layer comprises one or more of epoxy resin, silicone rubber, polyimide (PI), polybenzoxazole (PBO), benzocyclobutene (BCB), silicon oxide, phosphorosilicate glass, and fluorine-containing glass; and wherein each of a material of the first metal wiring layer and a material of the second metal wiring layer comprises one or more of copper, aluminum, nickel, gold, silver, and titanium.

4. The method for making the double-layer stacked 3D fan-out packaging structure according to claim 3, wherein the forming of the first rewiring layer and forming of the second rewiring layer each comprises:

forming a dielectric layer using a chemical vapor deposition process or a physical vapor deposition process, and etching the dielectric layer to form the wiring dielectric layer, and forming a metal layer on a surface of the wiring dielectric layer using a chemical vapor deposition process, a physical vapor deposition process, a sputtering process, an electroplating process, or an electroless plating process, and etching the metal layer to form a metal wiring layer, wherein the metal connecting pillar is electrically connected to the metal wiring layer.

5. The method for making the double-layer stacked 3D fan-out packaging structure according to claim 1, wherein the first semiconductor chip comprises a first bare chip of the first semiconductor chip or a first packaged chip of the first semiconductor chip.

6. The method for making the double-layer stacked 3D fan-out packaging structure according to claim 5, wherein the first bare chip of the first semiconductor chip comprises a contact pad, a dielectric layer formed on the contact pad, and a metal pillar formed in the dielectric layer and penetrating the dielectric layer, and wherein one end of the metal pillar is connected to the contact pad and another end of the metal pillar is connected to the first rewiring layer.

7. The method for making the double-layer stacked 3D fan-out packaging structure according to claim 5, wherein the first packaged chip of the first semiconductor chip comprises a contact pad, wherein a solder connection structure is formed on the first packaged chip of the first semiconductor chip, and the solder connection structure comprises a metal pillar and a solder ball, wherein one end of the metal pillar is connected to the contact pad, another end of the metal pillar is connected to the solder ball, and wherein the solder ball is connected to the first rewiring layer.

8. The method for making the double-layer stacked 3D fan-out packaging structure according to claim 1, wherein the second semiconductor chip comprises a second bare chip of the second semiconductor chip or a second packaged chip of the second semiconductor chip.

9. The method for making the double-layer stacked 3D fan-out packaging structure according to claim 8, wherein the second packaged chip of the second semiconductor chip comprises a contact pad, wherein a solder connection structure is formed on the second packaged chip of the second semiconductor chip, wherein the solder connection structure comprises a metal pillar and a solder ball, wherein one end of the metal pillar is connected to the contact pad and another end of the metal pillar is connected to the solder ball, and wherein the solder ball is connected to the second rewiring layer.

10. The method for making the double-layer stacked 3D fan-out packaging structure according to claim 1, wherein forming the metal connecting pillar on the second rewiring layer by the wire bonding process comprises applying a hot-pressed wire bonding process, an ultrasonic wire bonding process, and a hot-pressed ultrasonic wire bonding process.

11. The method for making the double-layer stacked 3D fan-out packaging structure according to claim 8, wherein the second bare chip of the second semiconductor chip comprises a contact pad, a dielectric layer formed on the contact pad, and a metal pillar formed in the dielectric layer and penetrating the dielectric layer, and wherein one end of the metal pillar is connected to the contact pad and another end of the metal pillar is connected to the second rewiring layer.

* * * * *